(12) United States Patent
Shioya et al.

(10) Patent No.: US 6,673,725 B2
(45) Date of Patent: Jan. 6, 2004

(54) SEMICONDUCTOR DEVICE AND METHOD OF MANUFACTURING THE SAME

(75) Inventors: Yoshimi Shioya, Tokyo (JP); Kouichi Ohira, Tokyo (JP); Kazuo Maeda, Tokyo (JP)

(73) Assignees: Canon Sales Co., Inc. (JP); Semiconductor Process Laboratory Co., Ltd. (JP)

( * ) Notice: Subject to any disclaimer, the term of this patent is extended or adjusted under 35 U.S.C. 154(b) by 0 days.

(21) Appl. No.: 09/843,726

(22) Filed: Apr. 30, 2001

(65) Prior Publication Data

US 2001/0053614 A1 Dec. 20, 2001

(30) Foreign Application Priority Data

May 24, 2000 (JP) ........................................ 2000-153486

(51) Int. Cl.[7] .............................................. H01L 21/31
(52) U.S. Cl. ........................ 438/778; 438/584; 438/622; 438/623; 438/643; 438/680; 438/687; 438/758; 438/773; 438/780; 438/786; 438/788; 438/789; 438/790; 438/791; 438/793; 438/794
(58) Field of Search ................................. 438/584, 622, 438/623, 643, 680, 687, 758, 773, 780, 786, 788, 789, 790, 791, 793, 794

(56) References Cited

U.S. PATENT DOCUMENTS

| 5,040,046 A | * | 8/1991 | Chhabra et al. | ............. 438/793 |
| 5,470,800 A | | 11/1995 | Muroyama | .................. 437/238 |
| 5,593,741 A | * | 1/1997 | Ikeda | .................... 427/255.37 |
| 5,763,018 A | | 6/1998 | Sato | ........................... 427/535 |

FOREIGN PATENT DOCUMENTS

| EP | 0519079 A1 | 7/1992 |
| EP | 0 881 678 A2 | 5/1998 |
| JP | 11-288931 | 10/1999 |
| WO | 98/50945 | 7/1997 |
| WO | WO98/28465 | 7/1998 |
| WO | WO99/41423 | 8/1999 |
| WO | WO01/69642 A2 | 9/2001 |

OTHER PUBLICATIONS

Ishimaru et al., "Development of low–k Copper Barrier films deposited by PECVD using HMDSO, N2O, and NH3", Proceedings of the IEEE 2001 Intl. Interconnect Technology Conference, CA, Jun. 4, 2001, pp. 36–38.*
Muller et al., "Device Electronics for Integrated Circuits", pp. 102–103, 1977.*
Preparation of Low–k Porous Silica Films From Gas–Phase, Uchida et al, 4th Japanese Applied Physics Society Spring Meeting, p. 897 (1999).
Properties and Integration of Low k (k<3.0) PECVD Films, Shi et al, Semicon Korea Technical Symposium 2000, pp 279–283.
Preliminary Report of 60th Scientific Seminar of Japan Society of Applied Physics (Konan Univ. Sep. 1999) Inorgani Plasma low–k Matierals Matsuki et al.
Study of Porous Low–k Film Grown by Plasma enhanced Chemical Vapor Deposition, Endo et al, 46th Japanese Applied Physics Society Fal Meeting (1999) 1p–ZN–9(1999).
European Search Report, Application No. 01111236.4–1524.

* cited by examiner

*Primary Examiner*—Kamand Cuneo
*Assistant Examiner*—Lisa Kilday
(74) *Attorney, Agent, or Firm*—Lorusso, Loud & Kelly

(57) ABSTRACT

The present invention relates to a semiconductor device manufacturing method for forming an interlayer insulating film having a low dielectric constant by coating a copper wiring. The low dielectric constant insulating film is formed by reaction of a plasma of a film-forming gas containing an oxygen-containing gas of $N_2O$, $H_2O$, or $CO_2$, ammonia ($NH_3$), and at least one of an alkyl compound having a siloxane bond and methylsilane ($SiH_n(CH_3)_{4-n}$: n=0, 1, 2, 3).

11 Claims, 8 Drawing Sheets

Film Forming Conditions
  HMDSO Flow Rate: 50 sccm
  $N_2O$ Flow Rate: 200 sccm
  Gas Pressure: 1.75 Torr
  Substrate Temperature: 350°C
Plasmanizing Conditions
  Low Frequency Power: 0 W
  High Frequency Power: 300 W

SEMICONDUCTOR DEVICE AND METHOD OF MANUFACTURING THE SAME

BACKGROUND OF THE INVENTION

1. Field of the Invention

The present invention relates to a semiconductor device in which an interlayer insulating film having a low dielectric constant is formed by coating a copper wiring, and to a method of manufacturing the same.

2. Description of the Prior Art

In recent years, with the progress of the higher integration of semiconductor integrated circuit devices, higher speed of the data transfer rate is demanded. For this reason, an insulating film having a low dielectric constant to give only a small RC delay (referred to as a "low dielectric constant insulating film" hereinafter) is employed. Examples of such "low dielectric constant insulating films" are SiOF films having a relative dielectric constant of 3.5 to 3.8, and porous $SiO_2$ films having a relative dielectric constant of 3.0 to 3.1, etc.

In addition, a low dielectric constant interlayer insulating film having a relative dielectric constant on the order of 2 is needed. In order to form such a low dielectric constant interlayer insulating film, the plasma enhanced CVD method employing trimethylsilane ($SiH(CH_3)_3$) and $N_2O$ has been employed. For example, this plasma enhanced CVD method is set forth in M. J. Loboda, J. A. Seifferly, R. F. Schneider, and C. M. Grove: Electrochem. Soc. Fall Meeting Abstracts, p.344 (1998), etc. Also, the plasma enhanced CVD method employing tetramethylsilane ($SiH(CH_3)_4$) and $N_2O$ is set forth in J. Shi, M. A-Plano, T. Mountsier, and S. Nag; SEMICON Korea Technical Symposium 2000, p.279 (2000), etc.

In addition, a plasma enhanced CVD method employing phenylsilane, etc. has also been known. For example, such method is set forth in K. Endo, K. Shinoda, T. Tatsumi, 46-th Japanese Applied Physics Society Spring Meeting (1999), p.897, N. Matsushita, Y. Morisada, Y. Naito, S. Matsuno, 60-th Japanese Applied Physics Society Fall Meeting (1999), 1p-ZN-9(1999), Y. Uchida, T. Matsuzawa, S. Kanno, M. Matsumura, 4-th Japanese Applied Physics Society Spring Meeting, p.897 (1999), etc.

However, since the low dielectric constant interlayer insulating film formed by the plasma enhanced CVD method employing trimethylsilane ($SiH(CH_3)_3$) and $N_2O$ contains a large quantity of carbon (C), there is the problem that working by etching, etc., is difficult.

Also, in the low dielectric constant interlayer insulating film formed by the plasma enhanced CVD method employing the film-forming gas in the prior art, there is the problem that the relative dielectric constant varies widely with the film-forming conditions such as the plasmanizing power, the film-forming temperature, etc., and thus it is difficult to reliably get a relative dielectric constant on the order of 2.7.

SUMMARY OF THE INVENTION

It is an object of the present invention to provide a method of forming a low dielectric constant insulating film that can be easily worked by etching, etc., and has a relative dielectric constant on the order of 2.7, and a semiconductor device including such a low dielectric constant insulating film.

In the present invention, an interlayer insulating film having a low dielectric constant is formed by reaction of a plasma of a film-forming gas containing, as an oxygen-containing gas, $N_2O$, $H_2O$, or $CO_2$, ammonia ($NH_3$), and at least one of an alkyl compound having a siloxane bond and methylsilane ($SiH_n(CH_3)_{4-n}$: n=0, 1, 2, 3).

By addition of ammonia ($NH_3$) to a mixed gas of the alkyl compound having the siloxane bond and an oxygen-containing gas selected from $N_2O$, $H_2O$, and $CO_2$, the amount of oxygen (O) can be finely controlled, and thus the insulating film will have an appropriate amount of carbon (C) and a relative dielectric constant on the order of 2.7.

Likewise, if ammonia ($NH_3$) is added to a mixed gas of methylsilane ($SiH_n(CH_3)_{4-n}$: n=0, 1, 2, 3) and an oxygen-containing gas selected from $N_2O$, $H_2O$, and $CO_2$, an insulating film having an appropriate amount of carbon (C) and a relative dielectric constant of on the order of 2.7 can be reliably formed.

Likewise, if ammonia ($NH_3$) is added to a mixed gas of the alkyl compound having the siloxane bond, the methylsilane ($SiH_n(CH_3)_{4-n}$: n=0, 1, 2, 3) and an oxygen-containing gas selected from $N_2O$, $H_2O$, and $CO_2$, an insulating film in which an amount of carbon (C) is appropriate and the relative dielectric constant is on the order of 2.7 can be reliably formed.

As described above, according to the present invention, since the film is formed by the plasma enhanced CVD method employing a film-forming gas to which ammonia ($NH_3$) is added, an insulating film containing an appropriate amount of carbon (C) and having a relative dielectric constant on the order of 2.7 can be thereby formed.

DESCRIPTION OF THE PREFERRED EMBODIMENTS

Embodiments of the present invention will be explained hereinafter with reference to the accompanying drawings.

First Embodiment

Figure 7:
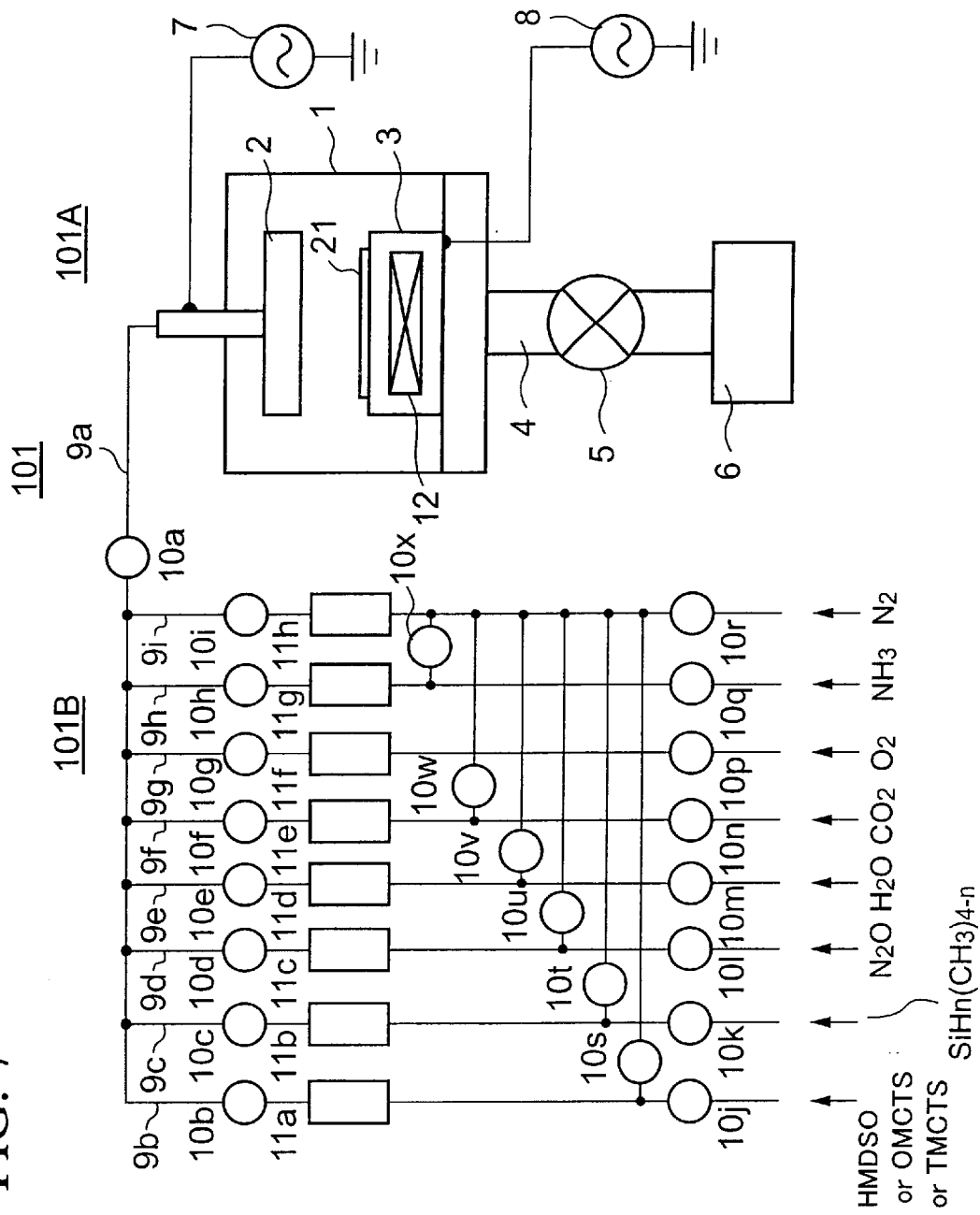
FIG. 7 is a side view of a plasma film-forming apparatus employed in the semiconductor device manufacturing method of the present invention.

FIG. 7 is a side view of a parallel-plate type plasma film-forming apparatus 101 employed in the semiconductor device manufacturing method of the present invention.

This plasma film-forming apparatus 101 comprises a film-forming portion 101A wherein a barrier insulating film is formed on a substrate 21 by the plasma gas, and a film-forming gas supply portion 101B having a plurality of gas supply sources for supplying the respective gases mixed to form the film-forming gas.

As shown in FIG. 7, the film-forming portion 101A includes a chamber 1 whose pressure can be reduced by an exhaust device 6 via exhaust pipe 4. A switching valve 5 that controls communication between the chamber 1 and the exhaust device 6 is provided in the middle of the exhaust pipe 4. A pressure measuring means such as a vacuum gauge (not shown), monitors the pressure in the chamber 1.

A pair of opposing electrodes, i.e., upper electrode (first electrode) 2 and lower electrode (second electrode) 3 are provided in the chamber 1. A power supply (RF power supply) 7 for supplying high frequency power having a frequency of 13.56 MHz is connected to the upper electrode 2, and also a power supply (LF power supply) 8 for supplying low frequency power having a frequency of 380 kHz is connected to the lower electrode 3. The film-forming gas is converted to a plasma by supplying power to the upper electrode 2 and to the lower electrode 3 from these power supplies 7, 8. The upper electrode 2, the lower electrode 3, and the power supplies 7, 8 constitute a plasma generating means for converting the film-forming gas to a plasma.

The upper electrode 2 is commonly used as a distributor for the film-forming gas. A plurality of through holes are formed in the upper electrode 2 facing the lower electrode 3 to serve as discharge ports (inlet ports) for the film-forming gas. The discharge ports for the film-forming gas, are connected to the film-forming gas supply portion 101B via a pipe 9a. Also, a heater (not shown) may be provided for the upper electrode 2. The heater is used to heat the upper electrode 2 to a temperature of about 100 to 200° C. during the film formation to prevent the particles of the reaction products from sticking on the upper electrode 2.

The lower electrode 3 is commonly used as a retaining table for a substrate 21, and has a heater 12 for heating the substrate 21.

Supply sources for hexamethyldisiloxane (HMDSO: $(CH_3)_3Si$—O—$Si(CH_3)_3$), methylsilane ($SiH_n(CH_3)_{4-n}$: n=0, 1, 2, 3), nitrogen monoxide ($N_2O$), water ($H_2O$), carbon dioxide ($CO_2$), oxygen ($O_2$), ammonia ($NH_3$), and nitrogen ($N_2$) are provided in the film-forming gas supply portion 101B. These gases are appropriately supplied to the chamber 1 of the film-forming portion 101A via branch pipes 9b to 9i and the pipe 9a to which all branch pipes 9b to 9f are connected. Flow rate controlling means 11a to 11h and switching means 10b to 10n, 10p and 10r for controlling the opening/closing of the branch pipes 9b to 9i are provided in the middle of the branch pipes 9b to 9i, and also a switching means 10a for controlling the opening/closing of the pipe 9a is provided in the middle of the pipe 9a. Also, in order to purge the residual gas from the branch pipes 9b to 9f, and 9h using $N_2$ gas, switching means 10s to 10x are provided for controlling communication between the branch pipe 9i connected to the $N_2$ gas supply source and other branch pipes 9b to 9f, and 9h. Thus, $N_2$ gas purges the residual gas from the pipe 9a and the chamber 1, in addition to the branch pipes 9b to 9f, and 9h.

Thus, the above film-forming apparatus 101 includes a supply source for the alkyl compound (HMDSO) having a siloxane bond (that is, an Si—O—Si bond), a supply source for the methylsilane ($SiH_n(CH_3)_{4-n}$: n=0, 1, 2, 3), an oxygen-containing gas supply source, an ammonia (NH3) supply source and plasma generating means 2, 3, 7, 8 for converting the film-forming gas to a plasma.

As a result, the insulating film having an appropriate content of carbon and low relative dielectric constant can be formed by the plasma enhanced CVD method. Therefore, as shown in a third embodiment to be described below, the barrier insulating film that has a low dielectric constant and which suppresses the diffusion of copper can be formed.

The plasma generating means may be first and second parallel-plate type electrodes 2, 3, means for generating the plasma by the ECR (Electron Cyclotron Resonance) method, or means for generating the helicon plasma by high frequency power radiated from an antenna, etc.

Power supplies 7, 8 for supplying high and low frequency power, respectively, are connected to the first and second parallel-plate type electrodes 2, 3 when utilized as the plasma generating means. Accordingly, the plasma can be generated by applying these high and low frequency powers to the electrodes 2, 3 respectively. In particular, since the insulating film formed in this manner is dense and contains $CH_3$, it has a low dielectric constant.

Suitable raw materials include:

(i) alkyl compounds having a siloxane bond:
hexamethyldisiloxane (HMDSO: $(CH_3)_3Si$—O—$Si(CH_3)_3$)
octamethylcyclotetrasiloxane (OMCTS:

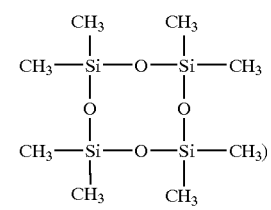

tetramethylcyclotetrasiloxane (TMCTS:

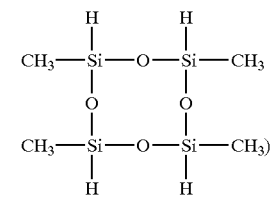

(ii) methylsilanes ($SiH_n(CH_3)_{4-n}$: n=0, 1, 2, 3)
monomethylsilane ($SiH_3(CH_3)$)
dimethylsilane ($SiH_2(CH_3)_2$)
trimethylsilane ($SiH(CH_3)_3$)
tetramethylsilane ($Si(CH_3)_4$)

(iii) gases containing oxygen
nitrogen monoxide ($N_2O$)
water ($H_2O$)
carbon dioxide ($CO_2$)

Next, a semiconductor device and a method of manufacturing the same according to the first embodiment of the present invention will be explained with reference to FIG. 1.

Figure 1A:
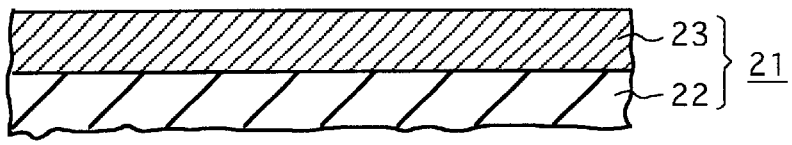
FIGS. 1A to 1F are sectional views showing a semiconductor device and a method of manufacturing the same according to a first embodiment of the present invention.

FIG. 1A is a sectional view showing the state after the copper wiring is formed. In FIG. 1A an underlying insulating film 22 and copper wiring 23 (lower wiring) together constitute a substrate 21.

Figure 1B:
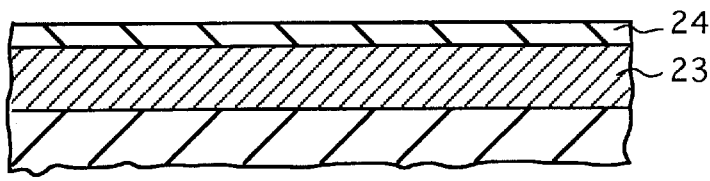

As shown in FIG. 1B, a barrier insulating film 24 is formed on the copper wiring 23 by the plasma enhanced CVD method. In order to form the barrier insulating film 24, first the substrate 21 is introduced into the chamber 1 of the plasma film-forming apparatus 101 and held by a substrate holder 3. Then, the substrate 21 is heated and the temperature is held at 350° C. Then, the hexamethyldisiloxane (HMDSO), the $N_2O$ gas, and the $CH_4$ gas are introduced into the chamber 1 of the plasma film-forming apparatus 101 shown in FIG. 7 at flow rates of 50 sccm, 30 sccm, and 25 sccm, respectively, and the pressure is kept at 1 Torr.

Then, a power of 100 W having a frequency of 380 kHz is applied to the lower electrode 3. No power is applied to the upper electrode 2. Spacing between the upper electrode 2 and the lower electrode 3 is set to less than 30 mm, preferably less than 25 mm. Also, the upper electrode 2 may be heated up to a temperature of about 100 to 200° C. to prevent sticking of the reaction products.

Accordingly, the hexamethyldisiloxane and the $N_2O$ are converted to a plasma. The barrier insulating film 24, i.e., an insulating film having a thickness of about 50 nm and containing Si, O, C, H, is formed by holding this state for a predetermined time. The resulting insulating film contains Si, O, C, H and has a relative dielectric constant of about 3.2, when measured at a frequency of 1 MHz, and a leakage current of $10^{-8}$ $A/cm^2$ when an electric field strength of 3 MV/cm is applied.

Figure 1C:
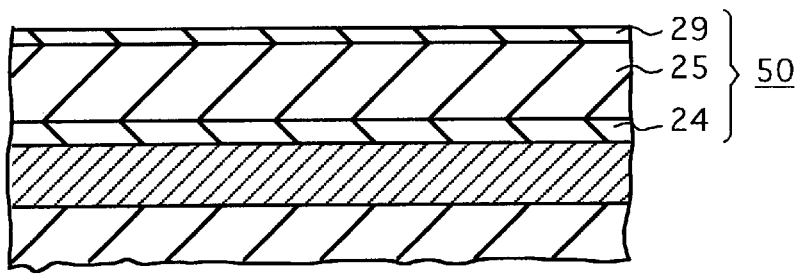

Then, as shown in FIG. 1C, a silicon-containing insulating film 25 having a low dielectric constant and a thickness of about 500 nm is formed by the well-known plasma enhanced CVD method. In order to form the silicon-containing insulating film 25, with the substrate 21 is held at the temperature of 350° C., the hexamethyldisiloxane (HMDSO), the $N_2O$ gas, and the $NH_3$ gas are introduced into the chamber 1 of the plasma film-forming apparatus 101 at flow rates of 50 sccm, 200 sccm, and x sccm, respectively, and the pressure is kept at 1.75 Torr. In order to determine how the properties of the silicon-containing insulating film 25 changes with change in the $NH_3$ gas flow rate, the $NH_3$ gas flow rate (x sccm) was changed in the range of 0 to 200 sccm.

Then, the high frequency power at 300 W having a frequency of 13.56 MHz is applied to the upper electrode 2. No power is applied to the lower electrode 3. In this case, the spacing between the upper electrode 2 and the lower electrode 3 is set to more than 20 mm, preferably more than 25 mm.

Then, an NSG film (silicon oxide film not containing an impurity) or an SiOC containing insulating film, both of which are thin and highly dense, is formed as a protection film 29 for the silicon-containing insulating film 25 for protection against ashing and etching. The insulating films 24, 25, 29 constitute an interlayer insulating film 50.

If the protection film 29 is not formed, there is a possibility that the silicon-containing insulating film 25 may be altered in quality by the processing gas in ashing of a photoresist film 26 or in etching of the barrier insulating film 24 formed under the silicon-containing insulating film 25, and thus the silicon-containing insulating film 25 would loose its low dielectric constant characteristic.

Figure 1D:
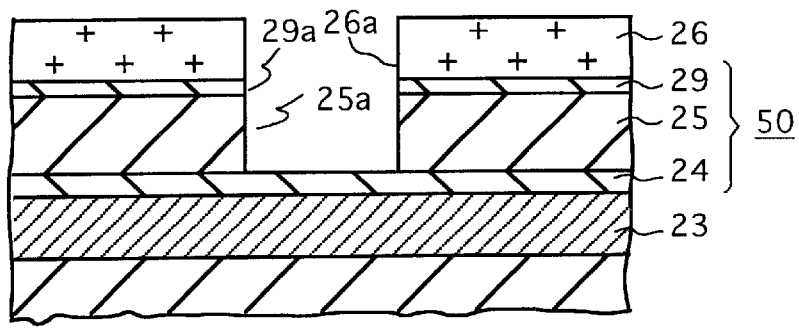

Then, as shown in FIG. 1D, a photoresist film 26 is formed, and then an opening 26a is formed in the photoresist film 26 in the area where a via-hole is to be formed by patterning the photoresist film 26. Then, the protection film 29 and the interlayer insulating film 25 are etched and removed at the opening 26a in the photoresist film 26 by the reactive ion etching (RIE), using a plasma of a mixed gas, of $CF_4+CHF_3$. Accordingly, openings 29a and 25a are formed to expose the barrier insulating film 24. Then, the photoresist film 26 is ashed. Because the barrier insulating film 24 has etching resistance against the etching gas and the ashing gas, the copper wiring 23 is not badly affected by the etching gas. The concentration of the mixed gas containing $CF_4+CHF_3$ may be adjusted by adding $Ar+O_2$, etc., to the $CF_4+CHF_3$.

Figure 1E:
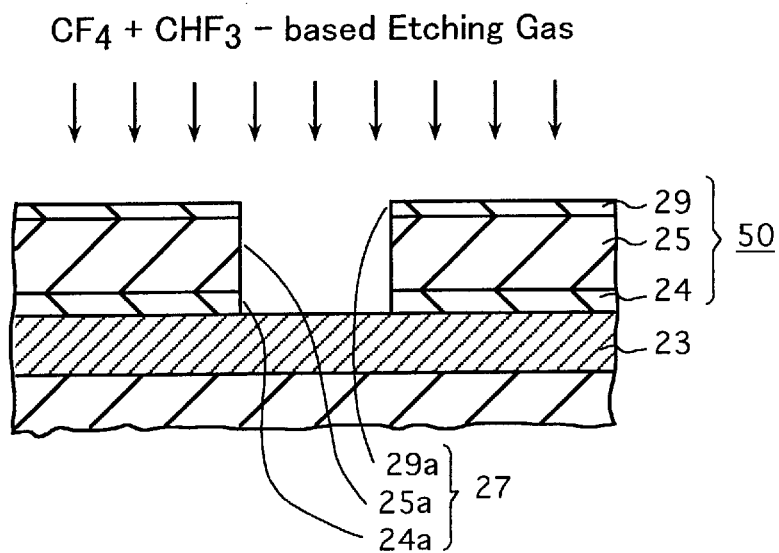

Then, as shown in FIG. 1E, the barrier insulating film 24 is etched via the opening 29a in the protection film 29 and the opening 25a in the interlayer insulating film 25 by reactive ion etching (RIE) using a plasma of a mixed gas of $CF_4+CHF_3$. The mixed gas containing $CF_4+CHF_3$ employed in the reactive ion etching (RIE) has a different ratio of components as compared with the mixed gas employed in etching the protection film 29 and the silicon-containing insulating film 25. Accordingly, an opening 24a is formed in the barrier insulating film 24, and thus a via hole 27 is formed in the interlayer insulating film 50 to expose the copper wiring 23 at its bottom. Because the copper wiring 23 has etching resistance against the etching gas for the above barrier insulating film 24, the copper wiring 23 is not badly influenced by the etching gas. In this case, the surface of the copper wiring is oxidized, but the oxidized surface of the copper wiring may be removed by exposure to a reducing gas, e.g., a hydrogen plasma which is diluted by $NH_3$ gas or an inert gas such as argon, nitrogen, or the like, after the etching of the barrier film.

Figure 1F:
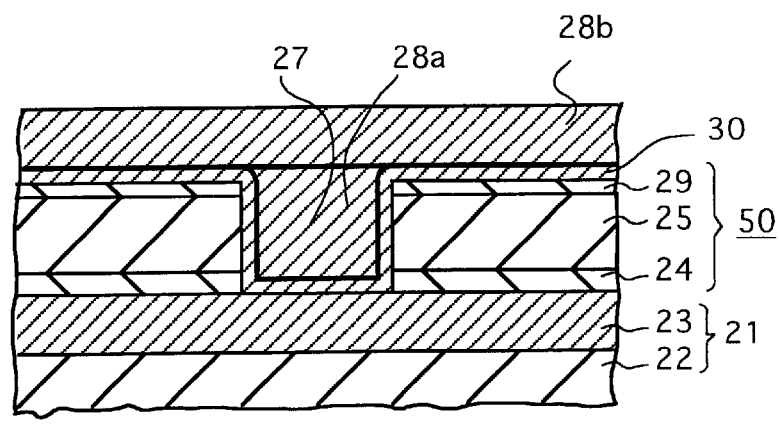

Then, as shown in FIG. 1F, a conductive film, e.g., an underlying conductive film 30 consisting of a barrier metal film such as tantalum nitride (TaN) or the like, and a copper film formed by sputtering is provided in the via hole 27. Then, a copper film 28a is buried on the underlying conductive film 30 and in the via hole 27. Then, an upper wiring 28b made of copper or aluminum is formed connected to the underlying wiring 23 via the copper film 28a.

Figure 2:
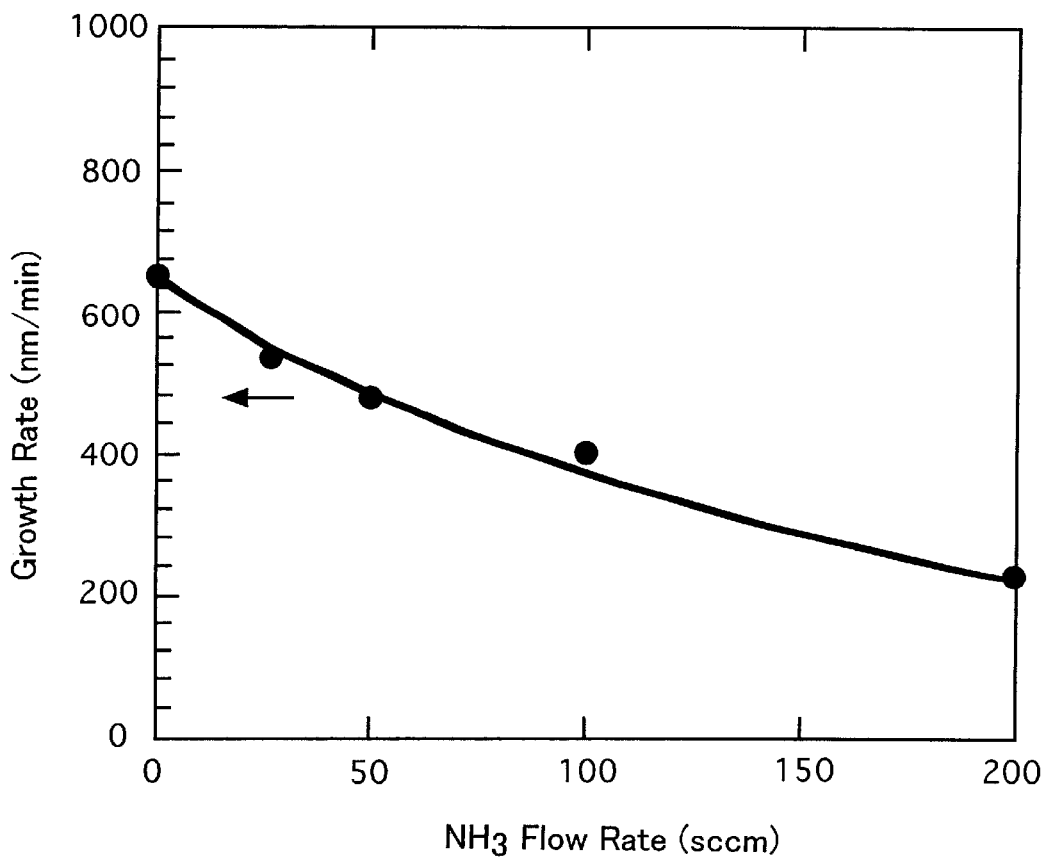
FIG. 2 is a graph showing growth rate of a low dielectric constant insulating film in the first embodiment of the present invention.
Figure 3:
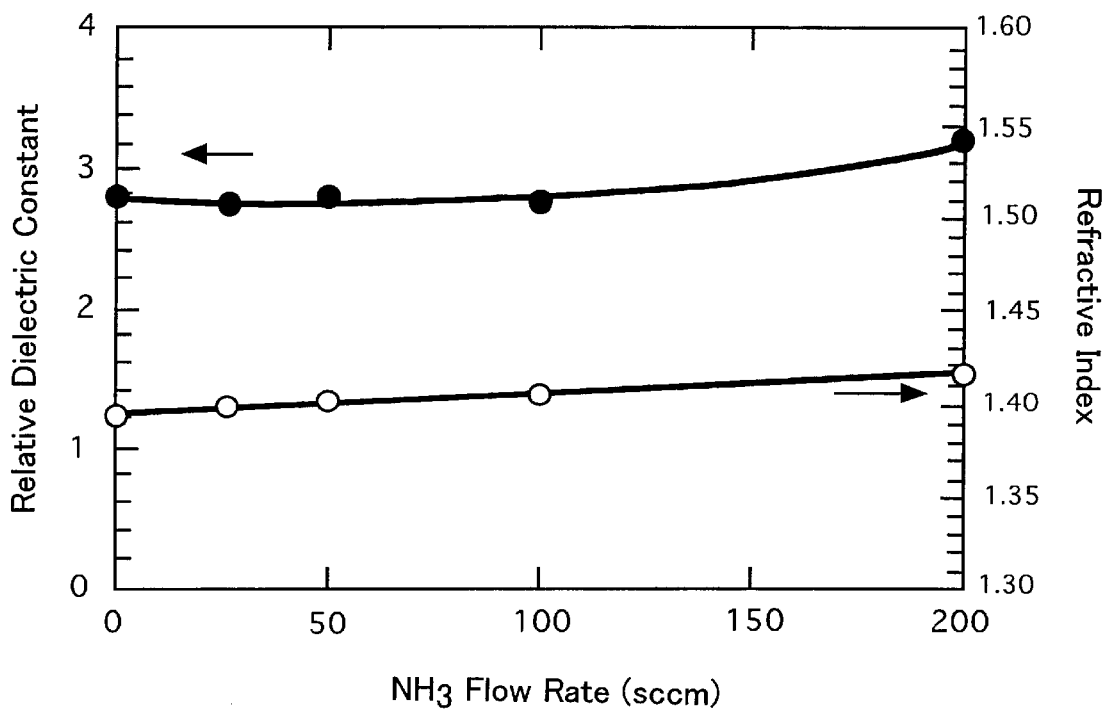
FIG. 3 is a graph showing characteristics of relative dielectric constant and refractive index of the low dielectric constant insulating film of the first embodiment of the present invention.
Figure 4:
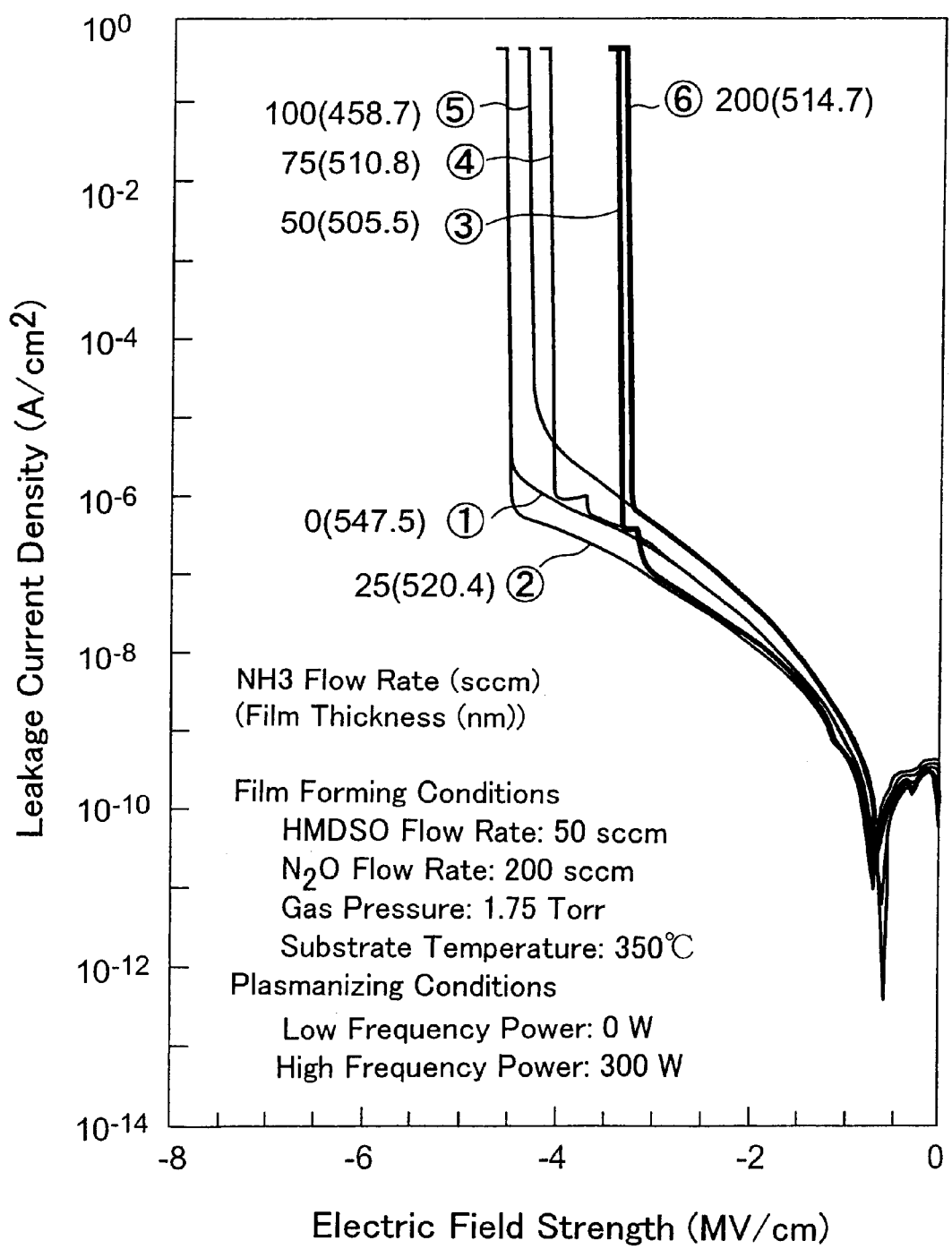
FIG. 4 is a graph of leakage current of the low dielectric constant insulating film of the first embodiment of the present invention.

The results of examination of characteristics of the barrier insulating film formed according to the present invention will now be explained with reference to FIG. 2 to FIG. 4. FIG. 2 is a graph showing growth rate of the silicon-containing insulating film and FIG. 3 is a graph of the relative dielectric constant and the refractive index of the silicon-containing insulating film versus the $NH_3$ flow rate. FIG. 4 is a graph of the leakage current flowing between the electrode and the substrate, that sandwich the silicon-containing insulating film therebetween.

Figure 5:
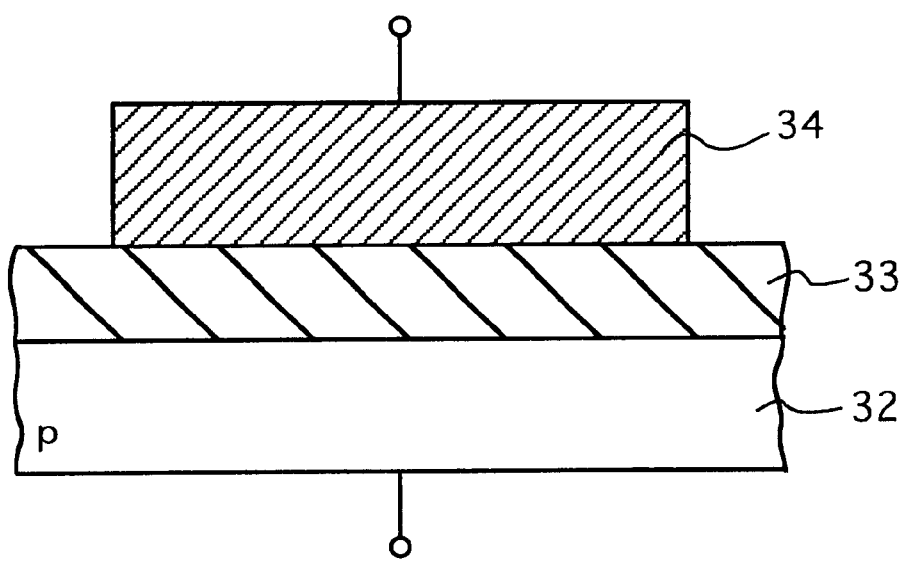
FIG. 5 is a sectional view showing structure of a sample of the low dielectric constant insulating film of the first embodiment of the present invention.

As shown in FIG. 5, a silicon-containing insulating film 33 is formed on a p-type silicon substrate 32 by the plasma enhanced CVD method using HMDSO, $N_2O$, and $NH_3$ as the film-forming gas. Film-forming conditions of the silicon-containing insulating film 33 were as follows:

(i) Film-forming conditions
    HMDSO flow rate: 50 sccm
    $N_2O$ flow rate: 30 sccm
    $NH_3$ flow rate: 0, 25, 50, 75, 100, 200 sccm
    gas pressure: 1.75 Torr
    substrate heating temperature: 350° C.

(ii) plasma forming conditions
    high frequency power (13.56 MHz) $P_{HF}$: 300 W
    low frequency power (380 kHz) $P_{LF}$: 0 W
    spacing between the upper electrode and the lower electrode: more than 20 mm, preferably more than 25 mm The film thickness of the silicon-containing insulating film 33 was 547.5 nm, 505.5 nm, 510.8 nm, 458.7 nm, and 514.7 nm for respective $NH_3$ flow rates of 0, 25, 50, 75, 100, and 200 sccm.

A mercury probe 34 is brought into contact with the surface of the low dielectric constant insulating film 33. The electrode area of the mercury probe 34, which contacts to the low dielectric constant insulating film 33, is 0.0230 $cm^2$.

The C-V measuring method, in which the high frequency signal of 1 MHz is superposed on the DC bias, was employed to measure relative dielectric constant, and a He—Ne laser whose wavelength is 6338 Å in an ellipsometer was employed to measure refractive index. To measure the leakage current, the silicon substrate 32 is grounded and a negative voltage is applied to the mercury probe 34.

The measurements of the growth rate of the silicon-containing insulating film 33 are shown in FIG. 2. In FIG. 2, the ordinate denotes the growth rate (nm/min) represented in a linear scale, and the abscissa denotes the $NH_3$ flow rate (sccm) represented in a linear scale. As shown in FIG. 2, the growth rate is about 640 nm/min at a $NH_3$ flow rate of 0 sccm, and subsequently decreases with increase of the $NH_3$ flow rate, and is about 200 nm/min at a $NH_3$ flow rate of 200 sccm.

The measurements of the relative dielectric constant and the refractive index of the low dielectric constant insulating film are shown in FIG. 3. In FIG. 3, the left side ordinate denotes the relative dielectric constant represented on a linear scale, and the right side ordinate denotes the refractive index represented on a linear scale. The abscissa denotes the $NH_3$ flow rate (sccm) represented on a linear scale. As shown in FIG. 3, the relative dielectric constant is about 2.7 when the $NH_3$ flow rate is 0 sccm and about 3.1 when the $NH_3$ flow rate is 200 sccm, and increases with increase of the $NH_3$ flow rate. Also, the refractive index exhibits the same tendency, and is about 1.39 when the $NH_3$ flow rate is 0 sccm, and is about 1.42 when the $NH_3$ flow rate is 200 sccm.

The measurements of the leakage current of the low dielectric constant insulating film 33 are shown in FIG. 4. In FIG. 4, the ordinate denotes the leakage current density ($A/cm^2$) represented by a logarithmic scale, and the abscissa denotes electric field strength (MV/cm) that is applied to the silicon-containing insulating film 33 and represented by a linear scale. Symbols 1 to 6 indicate samples having different $NH_3$ flow rates. Also, the numeral in the parenthesis after the numeral indicating the flow rate (sccm) denotes the film thickness (nm). In this case, a negative value on the abscissa indicates that a negative potential was applied to the mercury probe 34.

As shown in FIG. 4, the leakage current is reduced as the $NH_3$ flow rate is lowered. It is preferable that the leakage current be suppressed to below $10^{-10}$ $A/cm^2$ with an electric field strength of 1 MV/cm in practical use.

The density of the normal $SiO_2$ film is almost 2.2 $g/cm^3$, whereas the density of the film formed according to the first embodiment of the present invention is almost 1.3 $g/cm^3$. This signifies that the film is porous and that the amount of carbon is reduced.

As described above, according to the first embodiment of the present invention, the silicon-containing insulating film 25 is formed as the main layer of the interlayer insulating film 50 by reacting a plasma of the film-forming gas containing the alkyl compound having the siloxane bond, $N_2O$ (oxygen-containing gas), and $NH_3$.

Since $NH_3$ is contained in the film-forming gas, the amount of carbon contained in the film can be reduced as compared to the case where no $NH_3$ is present. Also, the silicon-containing insulating film whose relative dielectric constant is on the order of 2.7 and has small variation of its relative dielectric constant can be reliably formed.

In the above, HMDSO is employed as the silicon compound that contains only silicon (Si), oxygen (O), carbon (C), and hydrogen (H). But the other silicon compounds mentioned above, e.g., octamethylcyclotetrasiloxane (OMCTS) or tetramethylcyclotetrasiloxane (TMCTS) may be employed.

Also, $N_2O$ is employed as the oxygen-containing gas. But water ($H_2O$) or carbon dioxide ($CO_2$) may be employed.

In addition, the interlayer insulating film of the present invention is applied to copper wiring. But the present invention may also be applied to aluminum or other wiring.

Second Embodiment

Figure 6A:
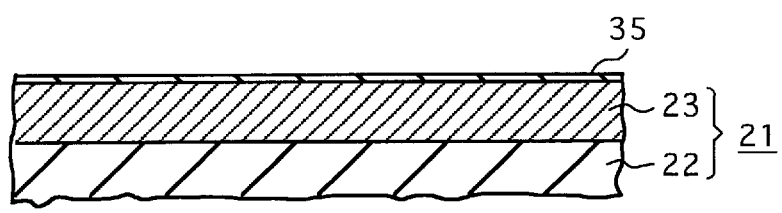
FIGS. 6A and 6B are sectional views showing a semiconductor device and a method of manufacturing the same according to a second embodiment of the present invention.
Figure 6B:
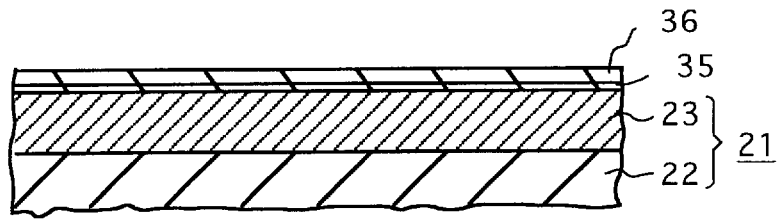

FIGS. 6A, 6B are sectional views showing a semiconductor device and a method of manufacturing the same according to a second embodiment of the present invention.

This second embodiment differs from the first embodiment of the present invention shown in FIG. 1 in that tetramethylsilane ($Si(CH_3)_4$) as is added to the above film-forming gas of silicon compound, $N_2O$, and $NH_3$. Another difference is that the low frequency power is applied to the lower electrode 3, that holds the substrate, and high frequency AC power is applied to the upper electrode 2 that opposes the lower electrode 3.

The film-forming conditions for the silicon-containing film employing the plasma enhanced CVD method using this film-forming gas are given hereunder. The silicon-containing film formed in this second embodiment has the low dielectric constant, and is formed as the main layer of the interlayer insulating film.

As shown in FIG. 6A, the copper wiring 23 and the barrier insulating film 35 covering this copper wiring 23 are formed on the underlying insulating film 22. Then, HMDSO, the $N_2O$ gas, the $NH_3$ gas, and tetramethylsilane ($Si(CH_3)_4$) are introduced into the chamber 1 of the plasma film-forming apparatus 101 shown in FIG. 7, and then the low dielectric constant insulating film 36 is formed on the barrier insulating film 35 by the plasma enhanced CVD method, as shown in FIG. 6B.

More particularly, the HMDSO, the $N_2O$ gas, the $NH_3$ gas, and tetramethylsilane ($Si(CH_3)_4$) are introduced into the chamber 1 of the plasma film-forming apparatus 101 shown in FIG. 7 at flow rates of 50 sccm, 200 sccm, 25 sccm, and 25 sccm, respectively, and then the gas pressure in the chamber 1 is maintained at 1.75 Torr. Subsequently, high frequency power of 300 W having a frequency of 13.56 MHz is applied to the upper electrode 2 of parallel-plate type opposing electrodes. No power is applied to the lower electrode 3 that opposes the upper electrode 2.

With the film-forming gas converted to a plasma, a low dielectric constant insulating film 36 of 500 nm in thickness is formed by maintaining these conditions for 50 seconds to cover the copper wiring 23.

It has been determined that the thus formed low dielectric constant insulating film 36 will have a relative dielectric constant of 2.7, and a leakage current on the order of $10^{-10}$ $A/cm^2$ with an electric field strength of 1 MV/cm.

In this second embodiment also, a silicon-containing insulating film 25 having a relative dielectric constant on the order of 2.7 can be reliably formed as the main layer of the interlayer insulating film 50.

The second embodiment is described above as employing tetramethylsilane ($Si(CH_3)_4$) as the methylsilane. But any one of monomethylsilane ($SiH_3(CH_3)$), dimethylsilane ($SiH_2(CH_3)_2$), and trimethylsilane ($SiH(CH_3)_3$) may be employed instead.

While the present invention has been explained above by description of preferred embodiments, the scope of the present invention is not limited to the above embodiments, and modifications of the above embodiments without departing from the gist of the present invention are within the scope of the invention.

What is claimed is:

1. A semiconductor device manufacturing method for forming an insulating film having a low dielectric constant on a substrate, comprising:

providing a pair of parallel plate electrodes defining a space therebetween and holding the substrate on one of the electrodes;

introducing, into the space between the electrodes, a flow of a film-forming gas containing (1) at least one silicon compound selected from the group consisting of alkyl compounds having a siloxane bond and methylsilanes ($SiH_n(CH_3)_{4-n}$: n=0, 1, 2, 3), (2) an oxygen-containing gas selected from the group consisting of $N_2O$, $H_2O$ and $CO_2$, and (3) ammonia ($NH_3$);

setting the ratio of flow rate of ammonia to flow rate of the at least one silicon compound to provide the insulating film with a relative dielectric constant of 3.1 or less; and converting the film-forming gas into a plasma by application of AC power to the electrodes for reaction to form the insulating film.

2. A semiconductor device manufacturing method according to claim 1, wherein the methylsilane ($SiH_n(CH_3)_{4-n}$: n=0, 1, 2, 3) is any one selected from the group consisting of monomethylsilane ($SiH_3(CH_3)$), dimethylsilane ($SiH_2(CH_3)_2$), trimethylsilane ($SiH(CH_3)_3$), and tetramethylsilane ($Si(CH_3)_4$).

3. A semiconductor device manufacturing method according to claim 1, wherein the alkyl compound having the siloxane bond (Si—O—Si bond) is any one selected from the group consisting of hexamethyldisiloxane (HMDSO: $(CH_3)_3Si$—O—$Si(CH_3)_3$), octamethylcyclotetrasiloxane (OMCTS:

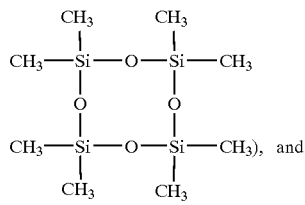

), and tetramethylcyclotetrasiloxane (TMCTS:

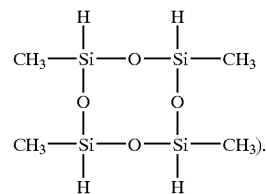

).

4. A semiconductor device manufacturing method according to claim 1, wherein AC power of a frequency of 100 kHz to 1 MHz is applied to the electrode that holds the substrate, in forming the film.

5. A semiconductor device manufacturing method according to claim 4, wherein an interval between the electrodes is set to more than 20 mm.

6. A semiconductor device manufacturing method according to claim 1, wherein AC power of a frequency of more than 1 MHz is applied to the electrode opposing the electrode that holds the substrate, in forming the film.

7. A semiconductor device manufacturing method according to claim 1, wherein spacing between the electrodes is set to more than 20 mm.

8. A semiconductor device manufacturing method according to claim 1, wherein a copper wiring is exposed from a surface of the substrate, a barrier insulating film is formed to cover the copper wiring and to come to contact with the copper wiring, and then the insulating film is formed on the barrier insulating film.

9. A semiconductor device manufacturing method according to claim 1 further comprising:

forming a protective film over the insulating film.

10. A semiconductor device manufacturing method according to claim 9 wherein said protective film is an NSG film or an SiOC containing film.

11. A semiconductor device manufacturing method according to claim 1 wherein the spacing between the electrodes is greater than 25 mm.

* * * * *